United States Patent
Kim et al.

(10) Patent No.: US 8,406,072 B2
(45) Date of Patent: Mar. 26, 2013

(54) SYSTEM AND METHOD OF REFERENCE CELL TESTING

(75) Inventors: Jung Pill Kim, San Diego, CA (US); Tae Hyun Kim, San Diego, CA (US); Hari M. Rao, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 170 days.

(21) Appl. No.: 12/861,259

(22) Filed: Aug. 23, 2010

(65) Prior Publication Data

US 2012/0044755 A1    Feb. 23, 2012

(51) Int. Cl.
    *G11C 29/00* (2006.01)
(52) U.S. Cl. ........... 365/201; 365/189.07; 365/210.1; 365/210.14; 365/205; 365/207
(58) Field of Classification Search ........... 365/201, 365/210.1, 205, 207, 210.14, 189.07
See application file for complete search history.

(56) References Cited

U.S. PATENT DOCUMENTS

| | | | |
|---|---|---|---|
| 5,844,832 A | 12/1998 | Kim | |
| 6,163,481 A * | 12/2000 | Yamada et al. | 365/185.11 |
| 6,163,484 A * | 12/2000 | Uekubo | 365/185.2 |
| 6,421,277 B2 * | 7/2002 | Tsunesada | 365/185.3 |
| 6,788,580 B2 * | 9/2004 | Takahashi | 365/185.2 |
| 6,809,976 B2 | 10/2004 | Ooishi | |
| 6,898,113 B2 | 5/2005 | Tsuji | |
| 6,947,322 B2 * | 9/2005 | Anzai et al. | 365/185.03 |
| 7,453,747 B2 | 11/2008 | Abraham et al. | |
| 2006/0140030 A1 | 6/2006 | Bedarida et al. | |
| 2008/0137433 A1 | 6/2008 | Kim et al. | |
| 2008/0279027 A1 | 11/2008 | Boeve | |
| 2009/0225586 A1 | 9/2009 | Ueda | |

FOREIGN PATENT DOCUMENTS

DE    19944037 C1    1/2001

OTHER PUBLICATIONS

International Search Report and Written Opinion—PCT/US2011/048672—ISA/EPO—May 15, 2012.

* cited by examiner

*Primary Examiner* — Pho M Luu
(74) *Attorney, Agent, or Firm* — Sam Talpalatsky; Nicholas J. Pauley; Jonathan T. Velasco

(57) ABSTRACT

Systems and methods of testing a reference cell in a memory array are disclosed. In a particular embodiment, a method of testing a reference cell in a memory array includes coupling a first reference cell of a first reference cell pair of the memory array to a first input of a first sense amplifier of the memory array. The method also includes providing a reference signal to a second input of the first sense amplifier. The reference signal is associated with a second reference cell pair of the memory array.

19 Claims, 8 Drawing Sheets

SYSTEM AND METHOD OF REFERENCE CELL TESTING

I. FIELD

The present disclosure is generally related to testing reference cells in a memory array.

II. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and Internet Protocol (IP) telephones, can communicate voice and data packets over wireless networks. Many such wireless telephones incorporate additional devices to provide enhanced functionality for end users. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities.

Such portable personal computing devices can include one or more memory devices to store information and software at the computing device. As memory device features become smaller, more information may be stored in a smaller device and a user experience with the computing device may be enhanced. However, electronic components may become more sensitive to physical variations that can occur during a manufacturing process and may be tested to ensure proper operation. An memory device that provides improved testing may therefore enable enhanced performance at a reduced manufacturing cost.

III. SUMMARY

A memory device enables reference cell testing by comparing a data signal from a selected reference cell to a reference signal from a pair of reference cells at a sense amplifier. A reference cell path may be routed to a data input of the sense amplifier. The reference signal may be applied to a reference input of the sense amplifier for comparison to with the signal from the reference cell under test.

In a particular embodiment, a method of testing a reference cell in a memory array includes coupling a first reference cell of a first reference cell pair of the memory array to a first input of a first sense amplifier of the memory array. The method also includes providing a reference signal to a second input of the first sense amplifier. The reference signal may be associated with a second reference cell pair of the memory array.

In another particular embodiment, an apparatus includes a sense amplifier within a memory array. The sense amplifier is operable to test a first reference cell of the memory array. The sense amplifier includes a data input to receive a first signal from the first reference cell. The sense amplifier also includes a second input to receive a signal from a reference source. The reference source may be a second reference cell pair of the memory array. The sense amplifier also includes comparator circuitry to output a comparator output value that is dependent upon the first signal received at the data input and upon the second signal received at the second input. The apparatus includes switching circuitry that is operable to reversibly couple the first reference cell to the data input.

One particular advantage provided by at least one of the disclosed embodiments is that reference cell testing uses components that are also used for reading memory cells in the memory array, resulting in a reduced array size and cost as compared to using dedicated testing components or an external testing device. Reference cells may be tested and non-functional reference cells may be bypassed or replaced, resulting in improved performance of the memory array.

Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Figure 1:
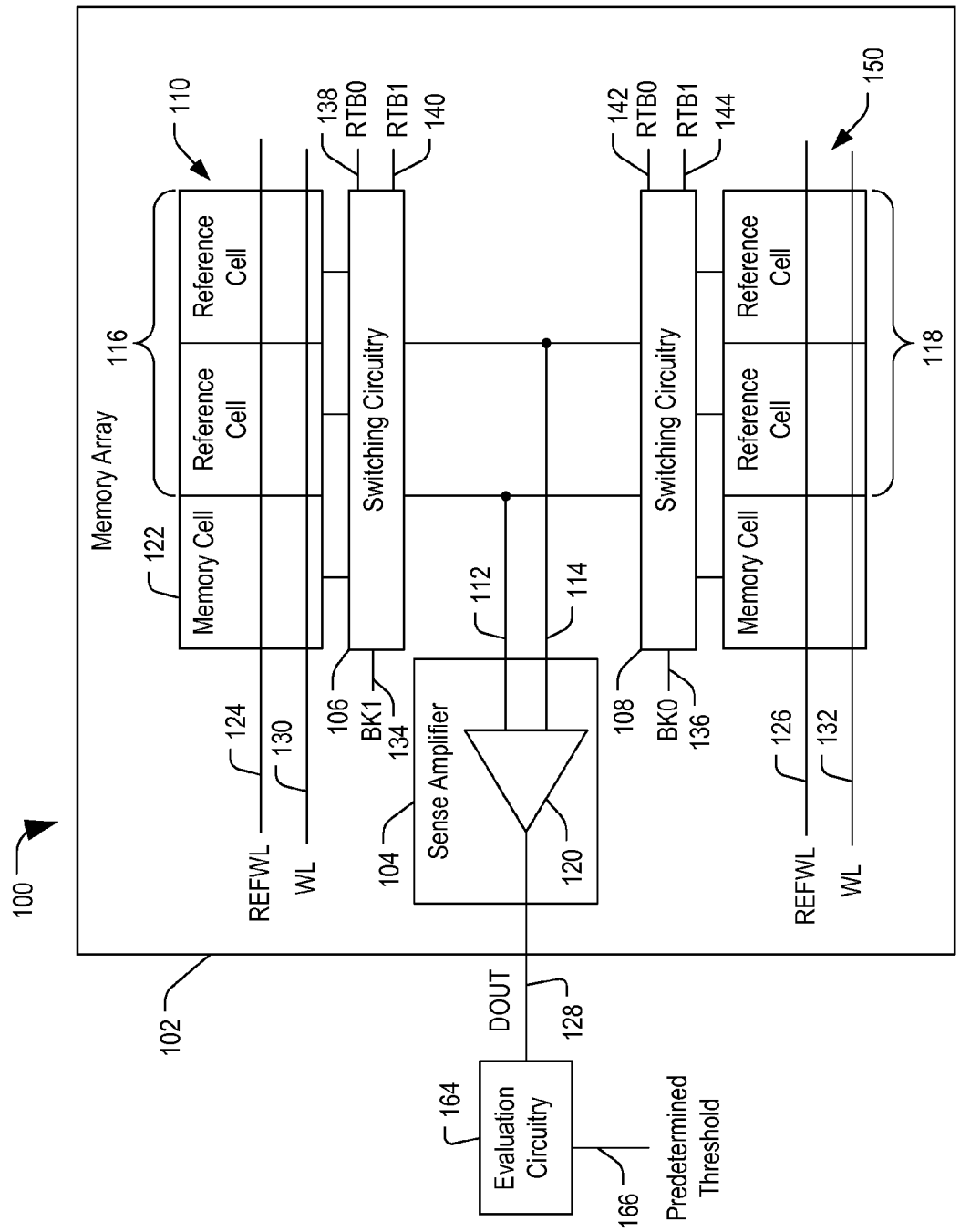
FIG. 1 is a block diagram of a first illustrative embodiment of a system that is configured to test reference cells of a memory array.

Referring to FIG. 1, a particular embodiment of a system 100 that includes a memory array 102 is shown. The system 100 also includes evaluation circuitry 164. The evaluation circuitry 164 is responsive to a predetermined threshold 166 and receives a data output 128 from the memory array 102. The memory array 102 includes a sense amplifier 104, first switching circuitry 106, second switching circuitry 108, a first memory element 110, and a second memory element 150.

The first memory element 110 may be a bank of the memory array 102 that shares the sense amplifier 104 with the second memory element 150, such as a second bank of the memory array 102. The first memory element 110 includes a representative first memory cell 122 and first and second reference cells 116. The first memory cell 122 and the reference cells 116 may be driven by a word line 130. Alternatively, the first memory cell 122 may be a dummy cell and the reference cells 116 may be driven by a dedicated reference word line 124 for accessing the reference cells 116.

The second memory element 150 includes a representative second memory cell and multiple reference cells 118. The second memory element 150 may include a word line 132 to access the second memory cell and the reference cells 118.

Alternatively, the second memory cell may be a dummy cell and the reference cells 118 may be accessed via a dedicated reference word line 126.

The first switching circuitry 106 includes a first selection input BK1 134 and multiple control inputs for switching RTB0 and RTB1 (138, 140). The second switching circuitry 108 includes a BK0 input 136 and includes the first and second selectors (RTB0, RTB1, 142, 144). The first switching circuitry 106 may be responsive to a signal at the BK1 input 134 to selectively couple an output of the memory cell 122 from the first memory element 110 to a data input (e.g. a first input 112) of the sense amplifier 104. The first switching circuitry 106 may be responsive to a signal at the RTB0 input 140 to selectively couple a reference signal output from the first memory element 110 to a reference input (e.g. a second input 114) of the sense amplifier 104. The first switching circuitry 106 may be responsive to a signal at the RTB1 input 138 to selectively couple a reference cell output from the first memory element 110 to the data input of the sense amplifier 104.

The second switching circuitry 108 may be responsive to a signal at the BK0 input 136 to selectively couple an output of the memory cell from the second memory element 150 to the data input of the sense amplifier 104. The second switching circuitry 108 may be responsive to a signal at the RTB1 input 144 to selectively couple a reference signal output from the second memory element 150 to the reference input of the sense amplifier 104. The second switching circuitry 108 may be responsive to a signal at the RTB0 input 142 to selectively couple a reference cell output from the second memory element 150 to the data input of the sense amplifier 104.

The sense amplifier 104 includes an operational amplifier or other comparator 120 that is responsive to the first input 112 and the second input 114. The first input 112 is output by either the first switching circuitry 106 or the second switching circuitry 108. The second input 114 is output by a second output of the first switching circuit 106 or a second output of the second switching circuitry 108. The sense amplifier 104 provides the output 128 to the evaluation circuitry 164. The sense amplifier 104 is operable to read content of a memory cell when the switching circuitry (e.g. switching circuitry 106 or 108) couples a memory cell of the memory array 102 to the first data input 112. In addition, the sense amplifier 104 is operable to read content of the memory cell when the memory cell is coupled to the data input and the first reference cell is decoupled from the data input.

During operation, the sense amplifier 104 that is used for sensing data values stored at memory cells may be used to test reference cells. A selected reference cell may be compared by the sense amplifier 104 to a reference signal (e.g. an average of reference cells) from a different memory element. For example, a value from a selected one of the reference cells 116 may be provided by the first switching circuitry 106 to the first input 112 of the sense amplifier 104 while a reference signal based on an average of the reference cells 118 may be provided by the second switching circuitry 108 to the second input 114 of the sense amplifier 104.

The comparator 120 compares the first input 112 to the second input 114 and thereby compares the selected first reference cell of the first memory element 110 to the average of the reference cells 118 of the second memory element 150. By comparing a selected reference cell of the first memory element 110 to the average of the reference cells 118 of the second memory element 150, the first selected reference cell of the first memory element 110 may be tested and evaluated to determine whether the first reference cell is void or functional. For example, the sense amplifier 104 may output a first value in response to the data signal from the first selected reference cell of the first memory 110 exceeding the average of the reference cells 118 and may output a second value in response to the data signal from the first selected reference cell not exceeding the average of the reference cells 118. The evaluation circuitry 164 may compare the output 128 of the sense amplifier 104 to the predetermined threshold 166 and provide an output to indicate whether the test was successful (e.g. whether the first reference cell is functional). For example, if the first reference cell is expected to store a logical high data value but the evaluation circuitry 164 determines that the output 128 does not exceed the predetermined threshold 166 (e.g. does not have a logical high value) the first reference cell can be identified as non-functional.

In an alternative embodiment, the output 128 of the sense amplifier 104 may have a value that is proportional to a difference between the values at the inputs 112 and 114. If the first reference cell of the first memory element 110 is significantly greater than or less than the average of the reference cells 118 then the evaluation circuitry 164 may determine that the data output 128 is greater than the predetermined threshold 166, indicating an error condition in the first selected reference cell.

In addition to testing the first reference cell of the first memory element 110, the memory array 102 may be used to test any of the reference cells. For example, by using either the word line 130 or the reference word line 124 and by use of the first switching circuitry 106 including the control inputs BK1 134, RTB0 138, RTB1 140, either the first reference cell or the second reference cell of the identified pair of reference cells 116 may be selected and provided to the sense amplifier 104 for comparison with a reference signals from another memory element.

As another example, a first reference cell of the second memory element 150 may be provided to either the first input 112 or the second input 114 of the sense amplifier 104 and a reference signal (e.g. an average of the reference cells 116 of the first memory element 110) may be provided to another of the inputs 112, 114 of the sense amplifier 104. In this manner, any of the reference cells in any of the memory elements in the memory array 102 may be tested with respect to a reference from a different memory element to determine whether the tested reference cell is functional. Once a particular reference cell is identified as failing the test, then the affected memory cell or reference cell may be identified as invalid and appropriate remedial measures may be taken within the memory array 102.

Thus, FIG. 1 illustrates an apparatus 100 that includes a sense amplifier 104 within a memory array 102. The sense amplifier 104 is operative to test a first reference cell of the memory array 102. The sense amplifier 104 includes a data input to receive a first signal from the first reference cell, a reference input to receive a second signal from a reference source, and comparator circuitry 120 to output a comparator output value 128. The output 128 is dependent on the first signal received at the data input (e.g. the first input 112) and upon the second signal received at the reference input (e.g. the second input 114). The apparatus 100 further includes switching circuitry that is operable to reversibly couple the first reference cell to the data input 112. For example, a first of the reference cells 116 may be selectively coupled by the first switching circuitry 106 to the first input 112 of the first sense amplifier 104. The apparatus further includes the evaluation circuitry 164 to determine that the first reference cell is operative when the comparator output value 128 satisfies the predetermined threshold 166. In a particular example, the reference source coupled to the second input 114 is coupled to a reference word line 126 of the memory array 102.

In a particular illustrative embodiment, the first reference cell is included in a first reference cell pair 116 that is coupled to the first reference word line 130 of the memory array 102. Alternatively, the first reference cell may be a selected cell from the second memory element 150, such as one of the reference cells within the reference cell pair 118. The first switching circuitry 106 is operable to test a second reference cell by reversibly coupling the second reference cell to the data input 112 and disconnecting the first reference cell from the data input 112. For example, the control inputs RTB0 138 and RTB1 140 may be applied to the first switching circuitry 106 so that the first switching circuitry 106 selectively outputs the second reference cell of the reference cell pair 116 as an output that is provided to the data input 112 of the sense amplifier 104.

Figure 2:
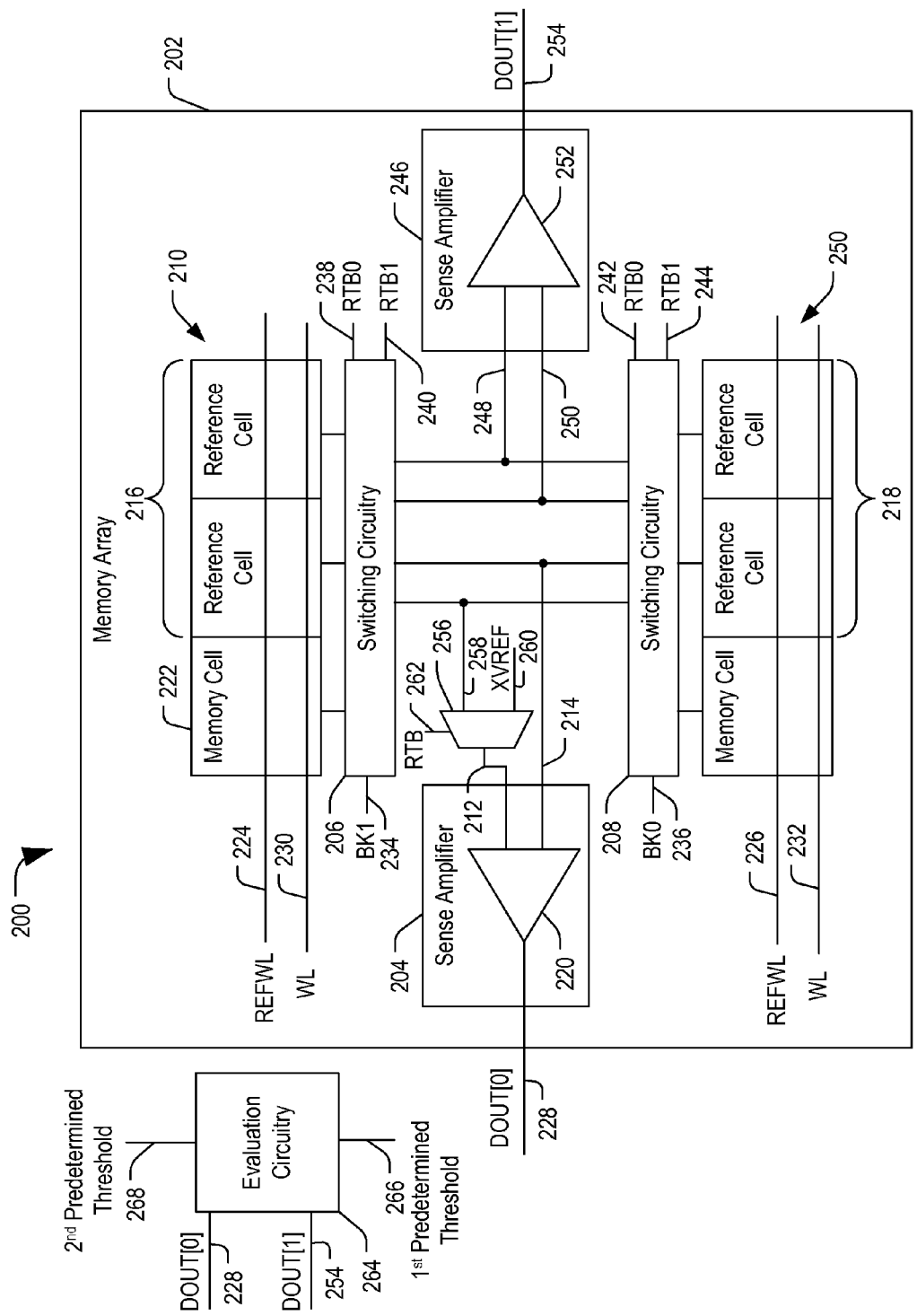
FIG. 2 is a block diagram of a second illustrative embodiment of a system that is configured to test reference cells of a memory array.

Referring to FIG. 2, a second illustrative embodiment of a system 200 including a memory array 202 is shown. The memory array 202 includes a first memory element 210 and a second memory element 250. The first memory element 210 is similar in structure to the first memory element 110 of FIG. 1 and the second memory element 250 is similar in structure to the second memory element 150 of FIG. 1. The first memory element 210 includes a memory cell 222, reference cells 216, a word line 230, and a reference word line 224. The second memory element 250 includes reference cells 218, a word line 232, and a reference word line 226. The first switching circuitry 206 includes a BK1 input 234 and includes multiple control inputs RTB0 (238) and RTB1 (240). Similarly, the second switching circuitry includes a BK0 input 236 and includes control inputs RTB0 (242) and RTB1 (244).

The memory array 202 includes a second sense amplifier 246 operable to test a second reference cell substantially simultaneously with a first sense amplifier 204 testing a first reference cell. The first and second reference cell may from a first pair of reference cells (e.g. reference cells 216) that are tested against a reference signal generated from a second pair of reference cells (e.g. reference cells 218). The first sense amplifier 204 is responsive to a first input 212 and to a second input 214. The second sense amplifier 246 is responsive to a first input 248 and a second input 250. Each of the inputs to the sense amplifiers 204 and 246 are responsive to outputs of the first and second switching circuitry 206 and 208.

The first sense amplifier 204 includes a first data input 214 to receive a first signal from the first reference cell, a first reference input 212 to receive a second signal from the second reference cell pair of the memory array, and first comparator circuitry 220 to operate the first comparator output 228. The first comparator output 228 is dependent upon the first signal received at the first data input 214 and the second signal received at the first reference input 212. The second sense amplifier 246 includes a second data input 248 to receive a third signal from the second reference cell, a second reference input 250 to receive a fourth signal from the second reference cell pair of the memory array, and second comparator circuitry 252 to output the second comparator output 254. The second comparator output 254 is dependent upon the third signal received at the second data input 248 and the fourth signal received at the second reference input 250.

The first comparator output 228 and the second comparator output 254 are provided as inputs to evaluation circuitry 264. The evaluation circuitry 264 includes circuitry or other logic to compare the comparator outputs to a first predetermined threshold 266 or to a second predetermined threshold 268, respectively. Thus, the predetermined thresholds 266 and 268 may be applied to respective ones of the inputs 228 and 254 to concurrently perform a test of selected reference cells, as described herein.

The memory array 202 includes switching circuitry that is operable to reversibly couple a first reference cell to the first data input 214 and to reversibly couple the second reference cell to the second data input 248. For example, first switching circuitry 206 may include a first switching circuit to reversibly couple one of the reference cells 216 to the first data input 214 and to concurrently reversibly couple the other of the reference cells 216 to the second data input 248.

The memory array 202 may further include a multiplexor 256 coupled to the reference input. The multiplexor 256 may be operable to selectively couple a reference signal generated by a pair of reference cells at an input 258 of the multiplexor 256 or an externally provided signal at an input 260 of the multiplexor 256 to the reference input 212. However, in other embodiments the memory array 202 may not use an external reference signal and may instead test reference cells at one bank using a pair of reference cells from another bank.

The memory array 202 may include a magnetic random access memory (MRAM) array. In addition, the memory array 202 and the evaluation circuitry 264 may be integrated in at least one semiconductor die. The semiconductor die including the memory array 202 and the evaluation circuitry 264 may be embedded in a device selected from the group consisting of a set top box, a music player, a video player, an entertainment unit, a navigation device, a communications device, a personal digital system (PDA), a fixed location data unit, and a computer. Thus, the sense amplifier 204 and the switching circuitry 206 and 208 may be integrated within a semiconductor device that is incorporated within any of the above mentioned devices.

The memory 202 includes multiple sense amplifiers such as the illustrated first sense amplifier 204 and the second sense amplifier 246. In addition, the first and second circuitry 206, 208 includes multiple outputs to enable multiple reference cells to be compared to other reference cells concurrently. For example, a first reference cell of the first memory element 210 may be compared to a reference signal based on an average of multiple reference cells 218 at the first sense amplifier 204 while a second reference cell of the first memory element 210 may be compared to a second reference signal based on an average of multiple reference cells 218 from the second memory element at the second sense amplifier 246. A result of the comparison at the first sense amplifier 204 may be provided as output 228 of the first sense amplifier 204 concurrently with the second sense amplifier 246 providing a second output 254.

Accordingly, circuitry within the memory array 202 including the evaluation circuitry 264 may be used to test each reference cell of each memory element within the memory array 202. Thus, the memory array elements 210 and 250 and reference cells therein may be selectively tested to determine whether the reference cells remain functional. In a particular illustrative embodiment, each of the memory elements within the memory array 202 includes resistive memory elements, such as a MRAM memory element or an STT-MRAM memory element. In this case, each of the reference cells may include MTJ elements and each of the memory cells also includes an MTJ element. While the memory array 202 may include resistive type memory elements, the memory array 202 may also include other types of memory elements such as static memory elements within a nonvolatile memory device.

Figure 3:
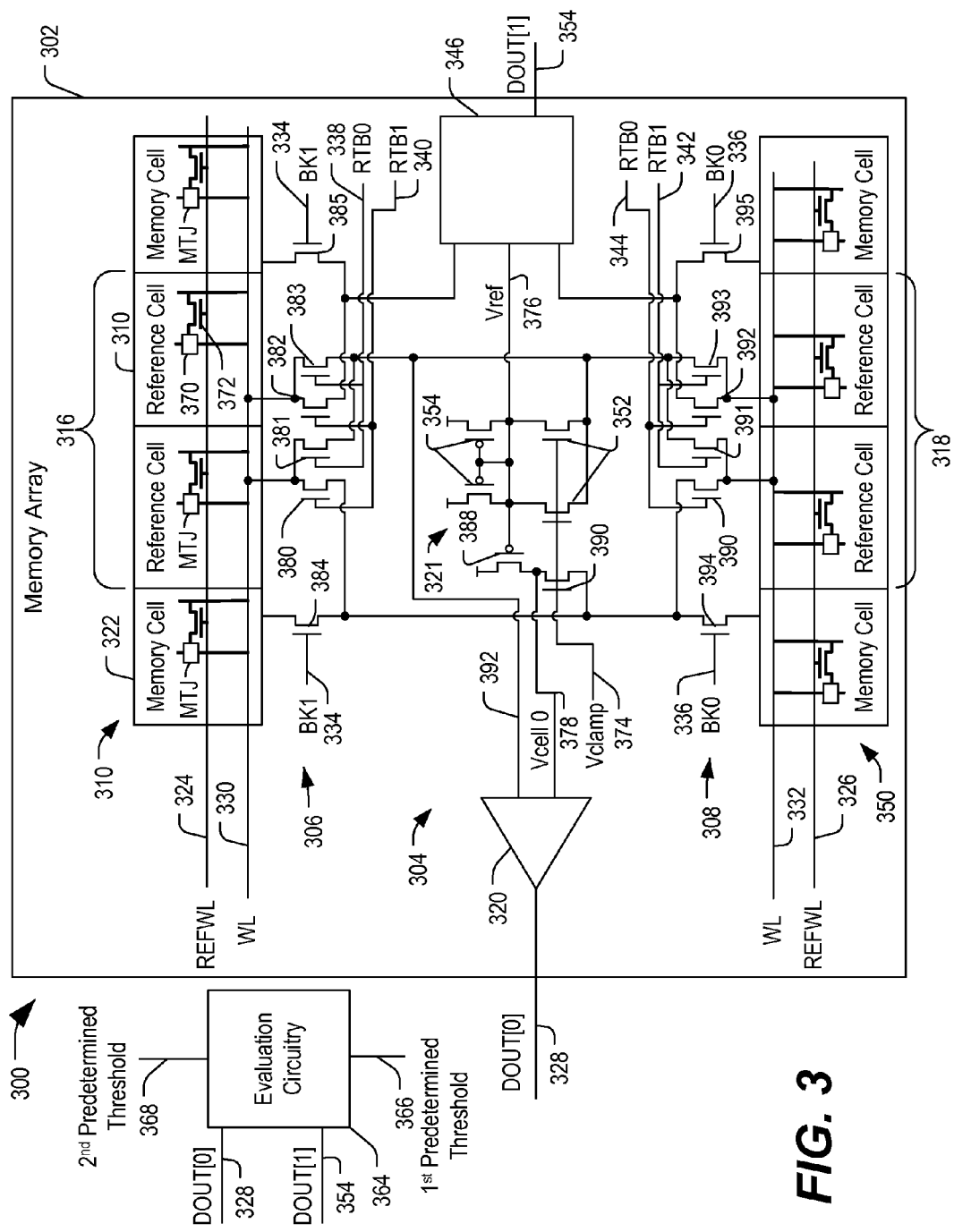
FIG. 3 is a circuit diagram of a third illustrative embodiment of a system that is configured to test reference cells of a memory array.

Referring to FIG. 3, a particular embodiment of a system 300 that includes a memory array 302 is shown. The memory array 302 has components that operate in a similar manner as corresponding components of the memory array 202 of FIG. 2.

The system 300 also includes evaluation circuitry 364. The evaluation circuitry 364 is responsive to a first predetermined threshold 366 and receives a first data output 328 from a first sense amplifier 304 of the memory array 302. The evaluation circuitry 364 is also responsive to a second predetermined threshold 368 and receives a second data output 354 from a second sense amplifier 346 of the memory array 302.

The memory array 302 also includes first switching circuitry 306 and second switching circuitry 308. A first bank 310 includes a representative memory cell 322 and a first pair of reference cells 316. The memory cell 322 and the first pair of reference cells 316 may be coupled to a word line 330. Alternatively, the memory cell 322 may be a dummy cell that is coupled to a dedicated reference word line 324 that is used to access the first pair of reference cells 316. A second bank 350 includes memory cells and also includes a second pair of reference cells 318 that may be coupled to a word line 332 or to a reference word line 326. A representative reference cell 310 includes a magnetic tunnel junction element (MTJ) 370 that is coupled to an access transistor 372. The access transistor 372 has a gate coupled to a word line to enable access to the MTJ 370.

The first switching circuitry 306 includes a memory cell access transistor 384 that is responsive to a bank 1 selection signal (BK1) 334 to selectively couple memory cells of the first bank 310 to a first input of a current sense amplifier circuit 321 that includes a clamp transistor 390 and a load transistor 388. The first switching circuitry 306 also includes a memory cell access transistor 385 that is responsive to BK1 334 to selectively couple memory cells of the first bank 310 to a second input (not shown) of the current sense amplifier circuit 321.

The first switching circuitry 306 includes reference cell access transistors 380 and 382 that are responsive to a bank 1 reference test selection signal (RTB1) 340 to selectively couple one reference cell of the first bank 310 (i.e. bank 1) to the first input of the current sense amplifier circuit 321 and to couple another reference cell of the first bank 310 to the second input of the current sense amplifier circuit 321. The first switching circuitry 306 includes reference cell access transistors 381 and 383 that are responsive to a bank 0 reference test selection signal (RTB0) 338 to selectively couple a pair of reference cells from the first bank 310 to a reference portion of the current sense amplifier circuit 321.

The second switching circuitry 308 has a configuration similar to the first switching circuitry 306. The second switching circuitry 308 includes memory cell access transistors 394 and 395 that are responsive to a bank 0 selection signal (BK0) 336 to selectively couple memory cells of the second bank 350 to the first and second inputs of the current sense amplifier circuit 321, respectively. The second switching circuitry 308 includes reference cell access transistors 390 and 392 that are responsive to an RTB0 signal 344 to selectively couple one reference cell to the first input of the current sense amplifier circuit 321 and another reference cell to the second input of the current sense amplifier circuit 321. The second switching circuitry 308 includes reference cell access transistors 391 and 393 that are responsive to an RTB1 signal 342 to selectively couple a pair of reference cells to the reference portion of the current sense amplifier circuit 321.

The reference portion of the current sense amplifier circuit 321 includes a pair of clamp transistors 352 configured to be coupled to a pair of reference cells in the first bank 310 or a pair of reference cells in the second bank 350. The pair of clamp transistors 352 is coupled to a pair of p-type load transistors 354 to generate a reference voltage Vref 376. The reference voltage Vref 376 is applied to a gate of the load transistor 388 to generate an input voltage (Vcell_0) 378 to a data input of comparison circuitry 320 of a voltage sense amplifier portion of the first sense amplifier 304. A reference signal 392 from the selected pair of reference cells is provided to a reference input of the comparison circuitry 320. The second sense amplifier 346 also includes a current sense amplifier portion and a voltage sense amplifier portion (not shown for clarity of illustration) and functions in a similar manner as the first sense amplifier 304.

During operation, memory cells in the first bank 310 may be read by setting BK1 334 to a high value and setting a selected word line, such as the WL 330, to a high voltage. The selected memory cells may be compared to a reference signal generated by a pair of reference cells coupled to a same word line as the selected memory cells in the first bank 310 by setting RTB0 338 to a high value and setting RTB1 340 to a low value. Transistors 390-395 of the second switching circuitry 308 are turned off.

Memory cells in the second bank 350 may be read by setting BK0 336 to a high value and setting a selected word line, such as the WL 332, to a high voltage. The selected memory cells may be compared to a reference signal generated by a pair of reference cells coupled to a same word line as the selected memory cells in the second bank 350 by setting RTB1 342 to a high value and setting RTB0 344 to a low value. Transistors 380-385 of the first switching circuitry 306 are turned off.

Alternatively, memory cells of one bank can be read using reference cells of the other bank by exchanging the RTB0 338 and RTB1 340 signals for the first bank 310 with the RTB0 344 and RTB1 342 signals for the second bank 350. The dedicated reference word line 326 or 330 may be selected to provide the reference signal for comparison to the selected memory cells.

In a reference cell testing mode, BK1 334 and BK0 336 are set to a low value. To test reference cells in the first bank 310, RTB1 340 and RTB1 342 are set to a high value and RTB0 338 and RTB0 344 are set to a low value. To test reference cells in the second bank 350, RTB1 340 and RTB1 342 are set to a low value and RTB0 338 and RTB0 344 are set to a high value.

Figure 4:
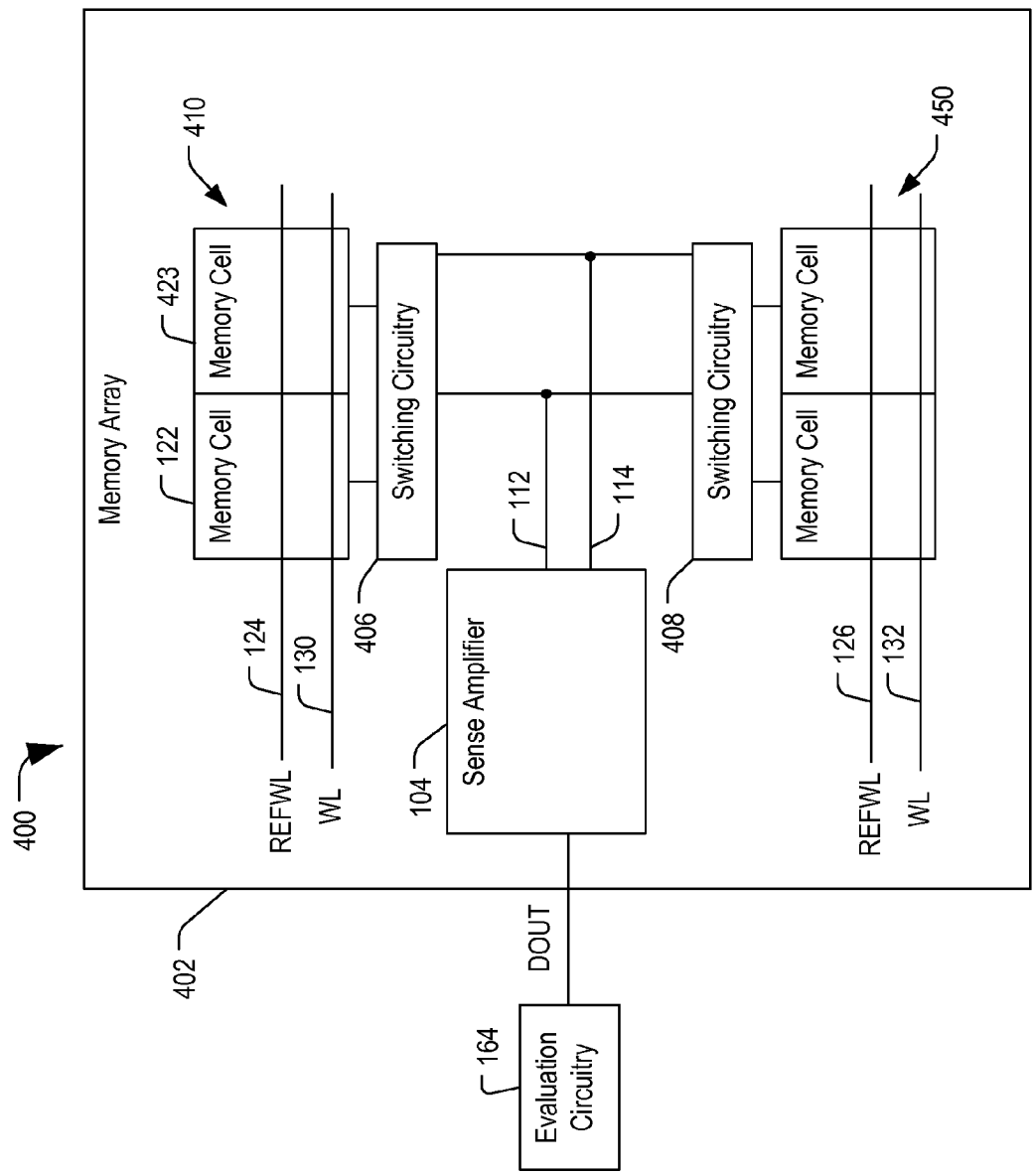
FIG. 4 is a block diagram of a fourth illustrative embodiment of a system that is configured to test reference cells of a memory array.

FIG. 4 depicts a particular embodiment of a system 400 that includes the evaluation circuitry 164 of FIG. 1 coupled to a memory array 402. The memory array 402 includes the sense amplifier 104 having the first input 112 and the second input 114 responsive to first switching circuitry 406 coupled to a first bank 410 and responsive to second switching circuitry 408 coupled to a second bank 450.

The first bank 410 includes the representative memory cell 122 and a second representative memory cell 423 that are coupled to a common word line, such as the word line (WL) 130 or the dedicated reference word line (REFWL) 124. The second bank 450 includes memory cells coupled to word lines such as the representative word line (WL) 132 or the dedicated reference word line (REFWL) 126.

The first bank 410 and the second bank 450 do not include dedicated reference cells, such as the dedicated pairs of reference cells 116 or 118 of FIG. 1. Memory cells in the first bank 410 may be read using a reference signal that is generated by memory cells of the second bank 450 that are used as reference cells. For example, the memory cells coupled to the REFWL 126 of the second bank 450 may be used as reference cells when a read operation is performed at the first bank 410. To illustrate, a pair of cells coupled to the REFWL 126 (one cell storing a logical "1" value and one cell storing a logical "0" value) may be accessed to generate a reference signal to be provided to the sense amplifier 104. In a similar manner, the memory cells coupled to the REFWL 124 in the first bank 410 may be used as reference cells when a read operation is performed at the second bank 450.

The first switching circuitry 406 and the second switching circuitry 408 may enable testing of the reference cells of the first bank 410 (e.g. memory cells coupled to the REFWL 124) using a reference signal generated by pairs of reference cells of the second bank (e.g. memory cells coupled to the REFWL 126 and storing complementary values). The switching circuitry 406 and 408 may also enable testing of the reference cells of the second bank 450 using a reference signal generated by pairs of reference cells of the first bank 410.

FIGS. 1-4 therefore illustrate various embodiments of a system that includes a means for testing a first reference cell of a memory array. A sense amplifier input, such as the input 112 of FIG. 1 or FIG. 4, the input 214 of FIG. 2, or the first input to the current sense amplifier 321 of FIG. 3 can correspond to first receiving means for receiving a first signal from the first reference cell. A second sense amplifier input, such as the input 114 of FIG. 1 or FIG. 4, the input 212 of FIG. 2, or the input to the reference portion of the current sense amplifier 321 of FIG. 3 (e.g. the pair of clamp transistors 352) can correspond to second receiving means for receiving a second signal from a reference source, where the reference source is a second reference cell pair of the memory array. The sense amplifier 104 of FIG. 1 or FIG. 4, the sense amplifier 204 of FIG. 2, or the sense amplifier 304 of FIG. 3 may correspond to means for providing a comparator output that is dependent upon the first signal received at the first receiving means and upon the second signal received at the second receiving means. The switching circuitry 106 and/or 108 or FIG. 1, the switching circuitry 206 and/or 208 of FIG. 2, the switching circuitry 306 and/or 308 of FIG. 3, or the switching circuitry 406 and/or 408 of FIG. 4 can correspond to means for reversibly coupling the first reference cell to the first receiving means. The evaluation circuitry 164 of FIG. 1 or FIG. 4, the evaluation circuitry 264 of FIG. 2, or the evaluation circuitry 364 of FIG. 3 may correspond to means for determining that the first reference cell is operative when the comparator output value satisfies a predetermined threshold.

With respect to the apparatus described with respect to FIG. 1-4, a method of testing a reference cell of a memory is disclosed. The method includes coupling a first reference cell of a first reference cell pair of a memory array to a first input of a first sense amplifier of the memory. The method further includes providing a reference signal to a second input of the first sense amplifier where the reference signal is associated with a second reference cell pair of the memory array. For example, the first reference cell of the reference cell pair 116 of the first memory element 110 may be coupled to a first input 112 of the sense amplifier 104 and a reference signal may be provided to the second input 114 of the sense amplifier 104. The reference signal may be associated with a second reference cell pair of the memory array (e.g. the second reference cell pair 118 of the memory element 150).

The method may further include, after coupling the first reference cell to the first input of the first sense amplifier and providing the reference signal to the second input of the first sense amplifier, determining whether the first reference cell is functional by comparing an output of the first sense amplifier to a first predetermined threshold. For example, the evaluation circuitry 164 may compare the output 128 from the sense amplifier 104 to the predetermined threshold 166. The method may further include, when the first reference cell is determined to be nonfunctional, replacing use of the first reference cell in the memory array by a redundant reference cell of the memory array. For example, if one of the reference cells from the reference cell pair 116 is determined to be nonfunctional, the nonfunctional reference cell may be replaced by a redundant reference cell within the memory array 102.

The method may further include coupling a second reference cell of the first reference cell pair to the first input of a second sense amplifier of the memory array, providing another reference signal to a second input of the second sense amplifier, and substantially simultaneously with determining whether the first reference cell is functional, determining whether the second reference cell is functional by comparing an output of the second sense amplifier to a second predetermined threshold. For example, a second reference cell of the reference cell pair 216 of the first memory element 210 may be concurrently compared to a second reference source from the second memory element 250 at the second sense amplifier 246. The method may further include, after coupling the first reference cell to the first input of the first sense amplifier and providing the reference signal to the second input of the first sense amplifier, measuring a first output of the first sense amplifier. For example, an output of the first sense amplifier 104 of the memory array 102 may be measured. To illustrate, the evaluation circuitry 164 may measure the output 128 of the first sense amplifier 104.

The method may further include decoupling the first reference cell from the first input of the first sense amplifier, coupling a second reference cell of the first reference cell pair the memory to the first input of the first sense amplifier the memory array, and measuring a second output of the first sense amplifier. For example, the first switching circuitry 106 may select a second reference cell of the reference cell pair 116 and may provide the selected second reference cell for comparison with a reference source at the first sense amplifier 104. In a particular illustrative embodiment, the first input of the first sense amplifier 104 may be used as a data input during a read operation of a memory cell of the memory array. In addition, the second input may be used as a reference input during a read operation of the memory cell of the memory array. A switch may be activated to couple the first reference cell to the first input upon selection by circuit control signals. For example, the first switching circuitry 106 may be activated to couple a first selected reference cell of the first reference cell pair 116 to be provided to the first input 112 of the first sense amplifier 104.

In a particular illustrative embodiment, the coupling of a first reference cell of a first reference cell pair of the memory array to a first input of a first sense amplifier of the memory array and providing a reference signal to a second input of the first sense amplifier is performed at a processor integrated into an electronic device. An example of a processor may be a digital signal processor or other processor within an electronic device.

Figure 5:
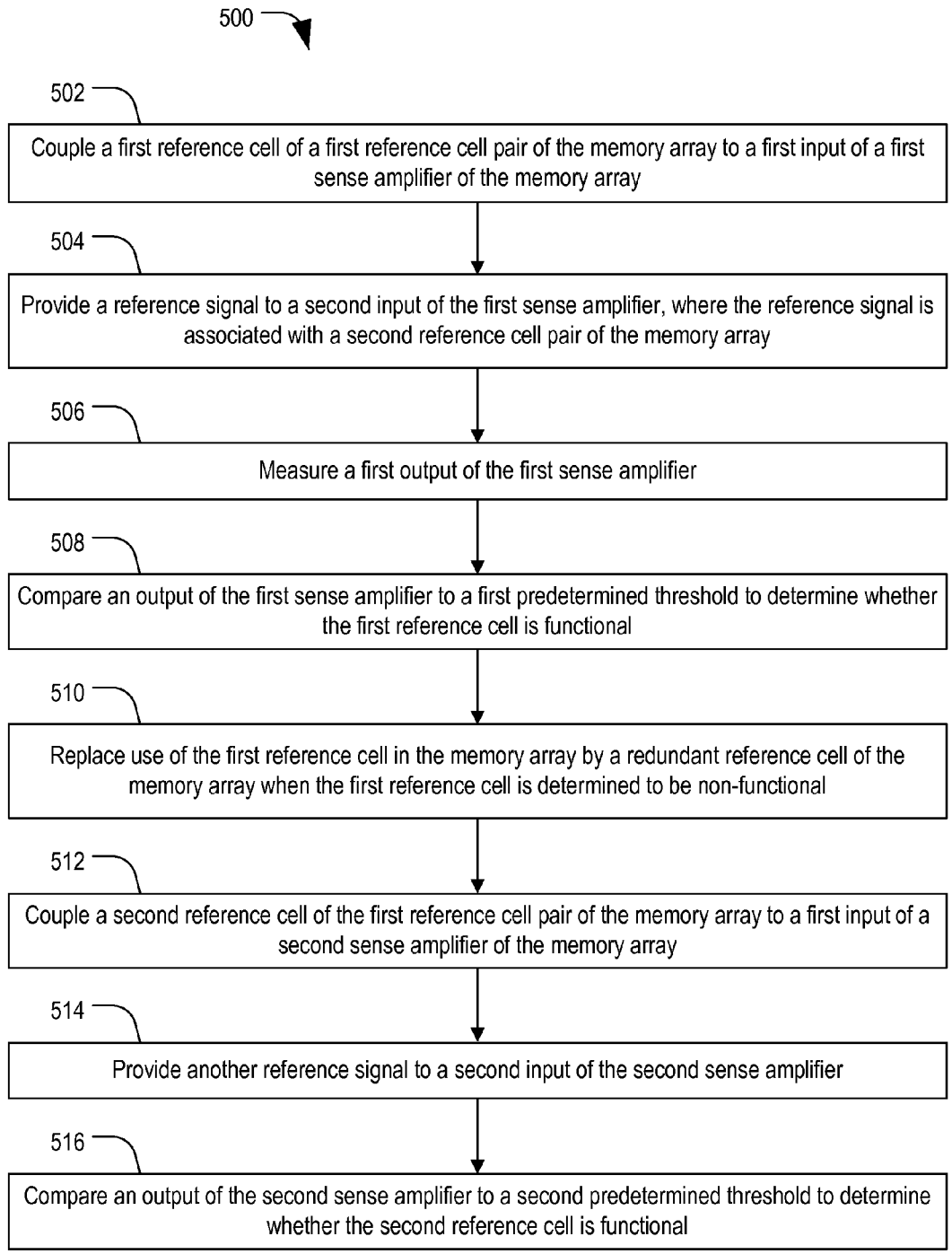
FIG. 5 is a flow chart of a first illustrative embodiment of a method of testing a reference cell in a memory array.

In reference to FIG. 5, a particular illustrative embodiment of a method of operation of circuitry within a memory array is shown. The method includes coupling a first reference cell in a first reference cell pair of the memory array to a first input of a first sense amplifier of a memory array, at 502, and providing a reference signal to a second input of the first sense amplifier, at 504. The reference signal is associated with a second reference cell pair of the memory array. The method further includes measuring a first output of the first sense amplifier at 506, and comparing an output of the first sense amplifier to a first predetermined threshold to determine whether the first reference cell is functional, at 508. The method further includes replacing use of the first reference cell in the memory array by a redundant reference cell of the memory array when the first reference cell is determined to be non-functional, at 510. In addition, the method further includes coupling a second reference cell of the first reference cell pair of the memory array to a first input of a second sense amplifier of the memory array, at 512. The method may optionally further include providing another reference signal to a second input of the second sense amplifier, at 514, and comparing an output of the second sense amplifier to a second predetermined threshold to determine whether the second reference cell is functional, at 516.

Figure 6:
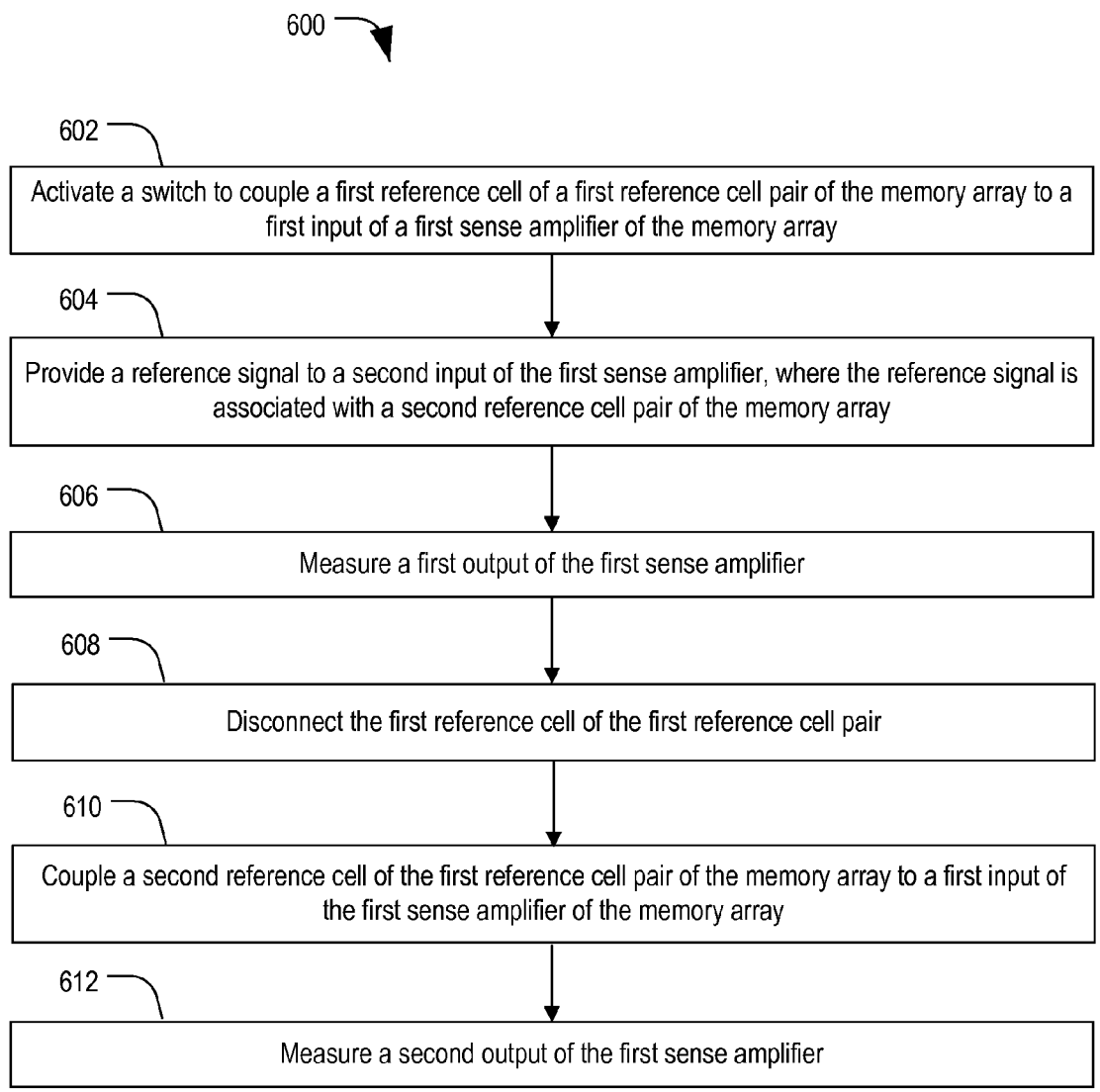
FIG. 6 is a flow chart of a second illustrative embodiment of a method of testing a reference cell in a memory array.

Referring to FIG. 6, another particular embodiment of a method of testing a reference cell within a memory array is shown. The method includes activating a switch to couple a first reference cell of a first reference cell pair of the memory array to a first input of a first sense amplifier of the memory array, at 602, and providing a reference signal to a second input of the first sense amplifier, where the reference signal is associated with a second reference cell pair of the memory array, at 604. The method further includes measuring a first output of the first sense amplifier, at 606.

The method may further include disconnecting the first reference cell of the first reference cell pair, at 608, coupling a second reference cell of the first reference cell pair of the memory array to a first input of the first sense amplifier of the memory array, at 610, and measuring a second output of the first sense amplifier, at 612.

Figure 7:
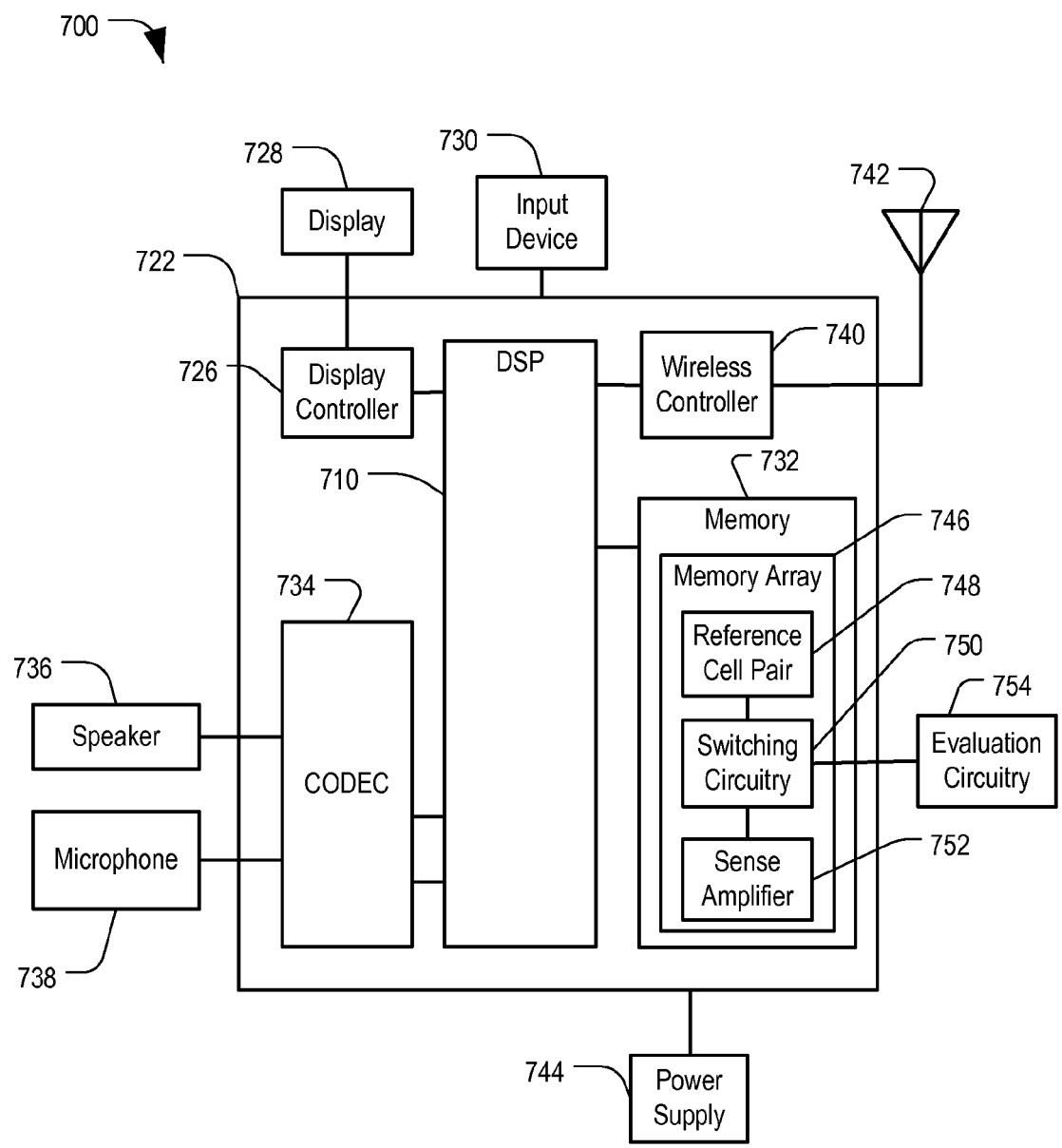
FIG. 7 is a block diagram of a particular embodiment of a communication device configured to test reference cells within a memory array.

Referring to FIG. 7, a block diagram of a particular illustrative embodiment of an electronic device configured to test a reference cell in a memory array 746, is depicted and generally designated 700. The device 700 includes a processor, such as a digital signal processor (DSP) 710, coupled to a memory 732. The memory 732 includes the memory array 746. In an illustrative embodiment, the memory 732 may correspond to the memory array 102 of FIG. 1, the memory array 202 of FIG. 2, the memory array 302 of FIG. 3, or the memory array 402 of FIG. 4, or may operate according to the methods of FIG. 5 or FIG. 6, or any combination thereof.

The memory array 746 includes a reference cell pair 748, switching circuitry 750, and a sense amplifier 752. The sense amplifier 752 is configured to receive a data signal from a memory cell and a reference signal from the reference cell pair 748 and to output a signal indicating a value stored at the memory cell. In a reference cell test mode, the device 700 is operable to configure the switching circuitry 750 to couple a reference cell to the data input of the sense amplifier 752 to test a value stored at the reference cell as compared to the reference signal from the reference cell pair 748. Evaluation circuitry 754 may be coupled to the memory array 746 to enable testing and evaluation by an off-chip testing process. Alternatively, the evaluation circuitry 754 may be implemented on-chip, such as via the processor 710. For example, the memory 732 may be a non-transient computer readable medium storing processor-executable instructions (not shown) that are executable by the processor 710 to cause the processor 710 to test reference cells of the memory array 746 by generating control signals to control the switching circuitry 750 and to selectively bypass or replace one or more reference cells determined to be non-functional based on a result of the evaluation circuitry 754 during a test mode of the memory array 746.

FIG. 7 also shows a display controller 726 that is coupled to the digital signal processor 710 and to a display 728. A coder/decoder (CODEC) 734 can also be coupled to the digital signal processor 710. A speaker 736 and a microphone 738 can be coupled to the CODEC 734.

FIG. 7 also indicates that a wireless controller 740 can be coupled to the digital signal processor 710 and to a wireless antenna 742. In a particular embodiment, the DSP 710, the display controller 726, the memory 732, the CODEC 734, and the wireless controller 740 are included in a system-in-package or system-on-chip device 722. In a particular embodiment, an input device 730 and a power supply 744 are coupled to the system-on-chip device 722. Moreover, in a particular embodiment, as illustrated in FIG. 7, the display 728, the input device 730, the speaker 736, the microphone 738, the wireless antenna 742, and the power supply 744 are external to the system-on-chip device 722. However, each of the display 728, the input device 730, the speaker 736, the microphone 738, the wireless antenna 742, and the power supply 744 can be coupled to a component of the system-on-chip device 722, such as an interface or a controller.

Figure 8:
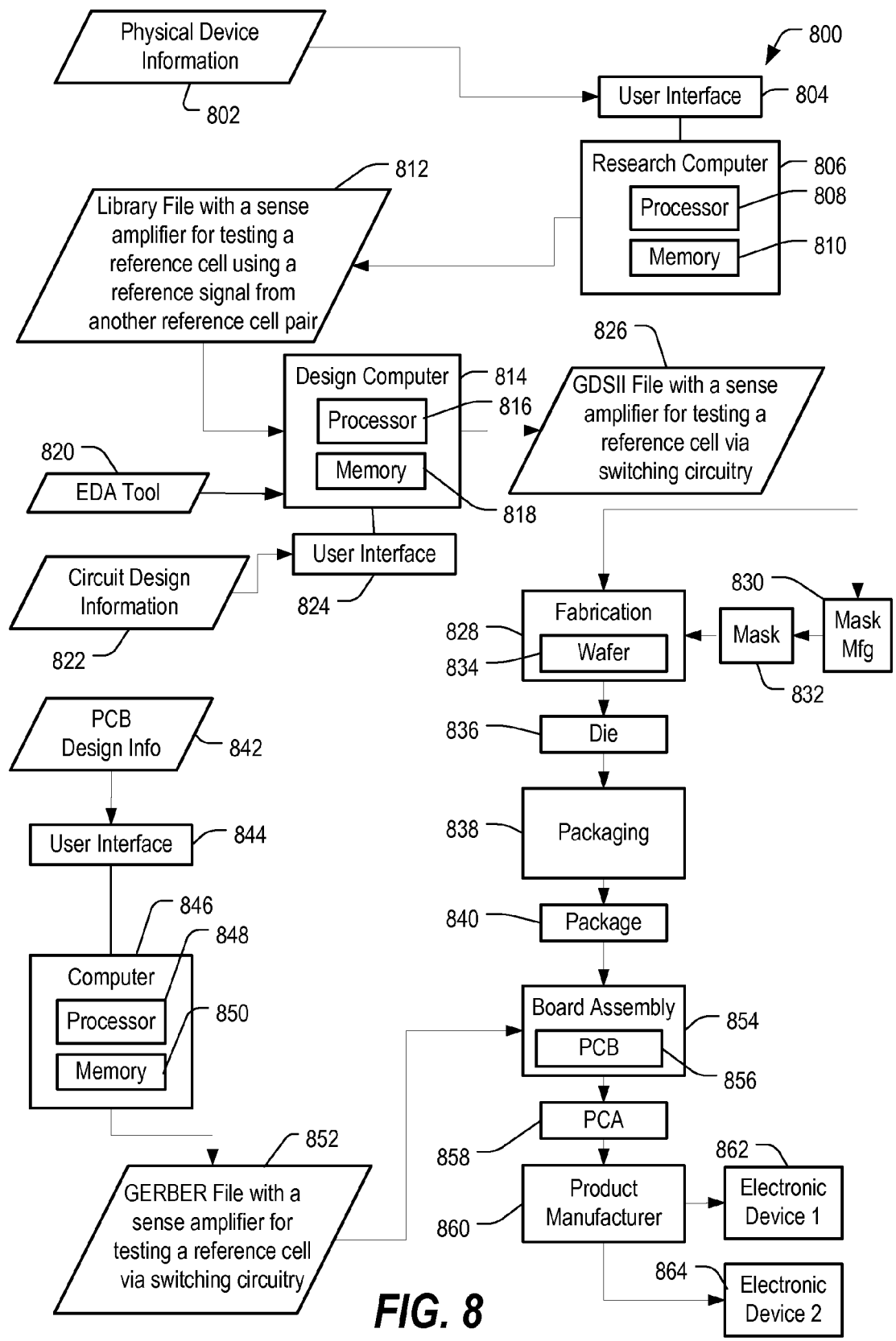
FIG. 8 is a flow diagram of a particular embodiment of a process to manufacture a device configured to test reference cells within a memory array.

FIG. 8 depicts a particular illustrative embodiment of an electronic device manufacturing process 800. Physical device information 802 is received at the manufacturing process 800, such as at a research computer 806. The physical device information 802 may include design information representing at least one physical property of a semiconductor device, such as the memory array 102 of FIG. 1, the memory array 202 of FIG. 2, the memory array 302 of FIG. 3, the memory array 402 of FIG. 4, or any combination thereof. For example, the physical device information 802 may include physical parameters, material characteristics, and structure information that is entered via a user interface 804 coupled to the research computer 806. The research computer 806 includes a processor 808, such as one or more processing cores, coupled to a computer readable medium such as a memory 810. The memory 810 may store computer readable instructions that are executable to cause the processor 808 to transform the physical device information 802 to comply with a file format and to generate a library file 812.

In a particular embodiment, the library file 812 includes at least one data file including the transformed design information. For example, the library file 812 may include a library of semiconductor devices including a device that includes the memory array 102 of FIG. 1, the memory array 202 of FIG. 2, the memory array 302 of FIG. 3, the memory array 402 of FIG. 4, or any combination thereof, that is provided to use with an electronic design automation (EDA) tool 820.

The library file 812 may be used in conjunction with the EDA tool 820 at a design computer 814 including a processor 816, such as one or more processing cores, coupled to a memory 818. The EDA tool 820 may be stored as processor executable instructions at the memory 818 to enable a user of the design computer 814 to design a circuit including the memory array 102 of FIG. 1, the memory array 202 of FIG. 2, the memory array 302 of FIG. 3, the memory array 402 of FIG. 4, or any combination thereof, of the library file 812. For example, a user of the design computer 814 may enter circuit design information 822 via a user interface 824 coupled to the design computer 814. The circuit design information 822 may include design information representing at least one physical property of a semiconductor device, such as a the memory array 102 of FIG. 1, the memory array 202 of FIG. 2, the memory array 302 of FIG. 3, the memory array 402 of FIG. 4, or any combination thereof. To illustrate, the circuit design property may include identification of particular circuits and relationships to other elements in a circuit design, positioning information, feature size information, interconnection information, or other information representing a physical property of a semiconductor device.

The design computer 814 may be configured to transform the design information, including the circuit design information 822, to comply with a file format. To illustrate, the file formation may include a database binary file format representing planar geometric shapes, text labels, and other information about a circuit layout in a hierarchical format, such as a Graphic Data System (GDSII) file format. The design computer 814 may be configured to generate a data file including the transformed design information, such as a GDSII file 826 that includes information describing the memory array 102 of FIG. 1, the memory array 202 of FIG. 2, the memory array 302 of FIG. 3, the memory array 402 of FIG. 4, or any combination thereof, in addition to other circuits or information. To illustrate, the data file may include information corresponding to a system-on-chip (SOC) that includes the memory array 102 of FIG. 1, the memory array 202 of FIG. 2, the memory array 302 of FIG. 3, or the memory array 402 of FIG. 4, and that also includes additional electronic circuits and components within the SOC.

The GDSII file 826 may be received at a fabrication process 828 to manufacture the memory array 102 of FIG. 1, the memory array 202 of FIG. 2, the memory array 302 of FIG. 3, the memory array 402 of FIG. 4, or any combination thereof, according to transformed information in the GDSII file 826. For example, a device manufacture process may include providing the GDSII file 826 to a mask manufacturer 830 to create one or more masks, such as masks to be used with photolithography processing, illustrated as a representative mask 832. The mask 832 may be used during the fabrication process to generate one or more wafers 834, which may be tested and separated into dies, such as a representative die 836. The die 836 includes a circuit including a device that includes the memory array 102 of FIG. 1, the memory array 202 of FIG. 2, the memory array 302 of FIG. 3, the memory array 402 of FIG. 4, or any combination thereof.

The die 836 may be provided to a packaging process 838 where the die 836 is incorporated into a representative package 840. For example, the package 840 may include the single die 836 or multiple dies, such as a system-in-package (SiP) arrangement. The package 840 may be configured to conform to one or more standards or specifications, such as Joint Electron Device Engineering Council (JEDEC) standards.

Information regarding the package 840 may be distributed to various product designers, such as via a component library stored at a computer 846. The computer 846 may include a processor 848, such as one or more processing cores, coupled to a memory 850. A printed circuit board (PCB) tool may be stored as processor executable instructions at the memory 850 to process PCB design information 842 received from a user of the computer 846 via a user interface 844. The PCB design information 842 may include physical positioning information of a packaged semiconductor device on a circuit board, the packaged semiconductor device corresponding to the package 840 including the memory array 102 of FIG. 1, the memory array 202 of FIG. 2, the memory array 302 of FIG. 3, the memory array 402 of FIG. 4, or any combination thereof.

The computer 846 may be configured to transform the PCB design information 842 to generate a data file, such as a GERBER file 852 with data that includes physical positioning information of a packaged semiconductor device on a circuit board, as well as layout of electrical connections such as traces and vias, where the packaged semiconductor device corresponds to the package 840 including the memory array 102 of FIG. 1, the memory array 202 of FIG. 2, the memory array 302 of FIG. 3, the memory array 402 of FIG. 4, or any combination thereof. In other embodiments, the data file generated by the transformed PCB design information may have a format other than a GERBER format.

The GERBER file 852 may be received at a board assembly process 854 and used to create PCBs, such as a representative PCB 856, manufactured in accordance with the design information stored within the GERBER file 852. For example, the GERBER file 852 may be uploaded to one or more machines to perform various steps of a PCB production process. The PCB 856 may be populated with electronic components including the package 840 to form a representative printed circuit assembly (PCA) 858.

The PCA 858 may be received at a product manufacture process 860 and integrated into one or more electronic devices, such as a first representative electronic device 862 and a second representative electronic device 864. As an illustrative, non-limiting example, the first representative electronic device 862, the second representative electronic device 864, or both, may be selected from the group of a set top box, a music player, a video player, an entertainment unit, a navigation device, a communications device, a personal digital assistant (PDA), a fixed location data unit, and a computer, into which the memory array 102 of FIG. 1, the memory array 202 of FIG. 2, the memory array 302 of FIG. 3, or the memory array 402 of FIG. 4 is integrated. As another illustrative, non-limiting example, one or more of the electronic devices 862 and 864 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 8 illustrates remote units according to teachings of the disclosure, the disclosure is not limited to these exemplary illustrated units. Embodiments of the disclosure may be suitably employed in any device which includes active integrated circuitry including memory and on-chip circuitry.

A device that includes the memory array 102 of FIG. 1, the memory array 202 of FIG. 2, the memory array 302 of FIG. 3, the memory array 402 of FIG. 4, or any combination thereof, may be fabricated, processed, and incorporated into an electronic device, as described in the illustrative process 800. One or more aspects of the embodiments disclosed with respect to FIGS. 1-7 may be included at various processing stages, such as within the library file 812, the GDSII file 826, and the GERBER file 852, as well as stored at the memory 810 of the research computer 806, the memory 818 of the design computer 814, the memory 850 of the computer 846, the memory of one or more other computers or processors (not shown) used at the various stages, such as at the board assembly process 854, and also incorporated into one or more other physical embodiments such as the mask 832, the die 836, the package 840, the PCA 858, other products such as prototype circuits or devices (not shown), or any combination thereof. Although various representative stages of production from a physical device design to a final product are depicted, in other embodiments fewer stages may be used or additional stages may be included. Similarly, the process 800 may be performed by a single entity or by one or more entities performing various stages of the process 800.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. An apparatus comprising:
    a sense amplifier within a memory array, the sense amplifier operable to test a first reference cell of a memory array, the sense amplifier comprising:
        a data input to receive a first signal from the first reference cell;
        a reference input to receive a second signal from a reference source, wherein the reference source is a second reference cell pair of the memory array; and
        comparator circuitry to output a comparator output value that is dependent upon the first signal received at the data input and upon the second signal received at the reference input; and
    switching circuitry that is operable to reversibly couple the first reference cell to the data input.

2. The apparatus of claim 1, further comprising evaluation circuitry to determine that the first reference cell is operative when the comparator output value satisfies a predetermined threshold.

3. The apparatus of claim 1, wherein the reference source is coupled to a reference word line of the memory array.

4. The apparatus of claim 1, wherein the sense amplifier is operable to read content of a memory cell when the switching circuitry couples a memory cell of the memory array to the data input, and wherein when the memory cell is coupled to the data input the first reference cell is decoupled from the data input.

5. The apparatus of claim 1, wherein the first reference cell is included in a first reference cell pair that is coupled to a first reference word line of the memory array.

6. The apparatus of claim 1, wherein the switching circuitry is operable to test a second reference cell by reversibly coupling the second reference cell to the data input and disconnecting the first reference cell from the data input.

7. The apparatus of claim 1, wherein the second reference cell pair is coupled to a second reference word line of the memory array.

8. The apparatus of claim 1, further comprising:
    a second sense amplifier operable to test a second reference cell substantially simultaneously with the first sense amplifier testing the first reference cell, the second sense amplifier including:
        a second data input to receive a third signal from the second reference cell;
        a second reference input to receive a fourth signal from the second reference cell pair of the memory array; and
        second comparator circuitry to output a second comparator output value that is dependent upon the third signal received at the second data input and the fourth signal received at the second reference input; and
    second switching circuitry that is operable to reversibly couple the second reference cell to the second data input.

9. The apparatus of claim 1, wherein the memory array is a magnetic random access memory (MRAM) array.

10. The apparatus of claim 1, wherein the sense amplifier and the switching circuitry are integrated in at least one semiconductor die.

11. The apparatus of claim 1, further comprising one of a set top box, a music player, a video player, an entertainment unit, a navigation device, a communications device, a personal digital assistant (PDA), a fixed location data unit, or a computer, into which the sense amplifier and switching circuitry are integrated.

12. An apparatus comprising:
    means for testing a first reference cell of a memory array, the means for testing comprising:
        first receiving means for receiving a first signal from the first reference cell;
        second receiving means for receiving a second signal from a reference source, wherein the reference source is a second reference cell pair of the memory array; and
        means for providing a comparator output value that is dependent upon the first signal received at the first receiving means and upon the second signal received at the second receiving means; and
    means for reversibly coupling the first reference cell to the first receiving means.

13. The apparatus of claim 12, further comprising means for determining that the first reference cell is operative when the comparator output value satisfies a predetermined threshold.

14. The apparatus of claim 12 wherein the means for testing and the means for reversibly coupling are integrated in at least one semiconductor die.

15. The apparatus of claim 12, further comprising one of a set top box, a music player, a video player, an entertainment unit, a navigation device, a communications device, a personal digital assistant (PDA), a fixed location data unit, or a computer, into which the means for testing and the means for reversibly coupling are integrated.

16. A non-transient computer readable tangible medium storing instructions executable by a processor, the instructions comprising:
    instructions that are executable by the processor to selectively couple a first reference cell of a first reference cell pair of a memory array to a first input of a first sense amplifier of the memory array; and instructions that are executable by the processor to provide a reference signal to a second input of the first sense amplifier, wherein the reference signal is associated with a second reference cell pair of the memory array.

17. The non-transient computer readable tangible medium of claim 16, the instructions further comprising:

instructions that are executable by the processor to determine whether the first reference cell is functional by comparing an output of the first sense amplifier to a first predetermined threshold after selectively coupling the first reference cell to the first input of the first sense amplifier and providing the reference signal to the second input of the first sense amplifier.

18. The non-transient computer readable tangible medium of claim 17, the instructions further comprising:

instructions that are executable by the processor to replace use of the first reference cell in the memory array by a redundant reference cell of the memory array when the first reference cell is determined to be non-functional.

19. The non-transient computer readable tangible medium of claim 16, the instructions further comprising:

instructions that are executable by the processor to selectively decouple the first reference cell of the first reference cell pair of the memory array from the first input of the first sense amplifier of the memory array after comparing an output of the first sense amplifier of the memory array to a predetermined threshold.

* * * * *